United States Patent [19]
Shin et al.

[11] Patent Number: 5,753,941
[45] Date of Patent: May 19, 1998

[54] VERTICAL CAVITY SURFACE EMITTING LASER

[75] Inventors: Hyun-kuk Shin, Suwon; Yong-hee Lee, Taejeon, both of Rep. of Korea

[73] Assignee: Samsung Electronics Co., Ltd., Kyungki-Do, Rep. of Korea

[21] Appl. No.: 620,324

[22] Filed: Mar. 22, 1996

[30] Foreign Application Priority Data

Mar. 23, 1995 [KR] Rep. of Korea ............... 1995-6215

[51] Int. Cl.$^6$ ........................... H01L 33/00
[52] U.S. Cl. ............. 257/98; 372/45; 372/96; 372/99
[58] Field of Search ............. 257/91, 98; 372/45, 372/96, 98, 99, 103, 107

[56] References Cited

U.S. PATENT DOCUMENTS 5,633,527  5/1997  Lear ........................... 257/98

Primary Examiner—Minh-Loan Tran
Attorney, Agent, or Firm—Sughrue, Mion, Zinn, Macpeak & Seas, PLLC

[57] ABSTRACT

A vertical cavity surface emitting laser (VCSEL) is provided which has a substrate, a first reflector layer formed on the substrate, an active layer formed on the first reflector layer, a second reflector layer formed on the active layer, and an electrode layer formed on the second reflector layer and having a cavity for emitting light from the second reflector layer. Laser light is generated in the active layer between the first and second reflective layers and is emitted through the second reflective layer at the cavity. The first and second reflective layers are each formed of semiconductor material containing impurities, such that the impurities in the first reflective layer are of an opposite type to the impurities in the second reflective layer. The electrode layer has a metal layer having a high electrical conductivity and a conductive auxiliary reflector layer formed between the metal layer and the second reflective layer. The auxiliary reflector layer has a reflectivity which is lower than the reflectivities of either of the first or second reflector layers.

8 Claims, 1 Drawing Sheet

VERTICAL CAVITY SURFACE EMITTING LASER

BACKGROUND OF THE INVENTION

The present invention relates to a vertical cavity surface emitting laser (VCSEL), and more particularly, to a VCSEL having an electrode layer which enhances the optical characteristics of the emitted light.

Generally, a VCSEL emits nearly circular Gaussian beams vertically from deposited semiconductor material layers, thus obviating the need for an optical system for correcting the configuration of emitted light, unlike an edge emitting laser. Further, since the VCSEL can be miniaturized, a plurality of VCSELs can be integrated on a single semiconductor wafer. Therefore, a two-dimensional arrangement of VCSELs is easy. These advantages make the VCSEL attractive for optical applications such as electronic calculators, audio/video devices, laser printers and scanners, medical equipment, and the communications field.

FIG. 1 illustrates a conventional VCSEL comprised of a substrate 10, and a first reflector layer 12, an active layer 14, a second reflector layer 16 and an electrode layer 20 which are all sequentially deposited on the substrate 10. Here, the substrate 10 is doped with a semiconductor material containing an n-type impurity, for example, n-type GaAs. The first reflector layer 12 is formed by alternately depositing on the substrate 10 semiconductor materials containing an impurity of the same type as that of the substrate, for example, n-type $Al_xGa_{1-x}As$ and n-type AlAs. The first reflector layer 12 has a reflectivity of about 99.9% and can transmit light in a particular wavelength range, which is lased in the active layer 14. The second reflector layer 16 is formed of the semiconductor material used for the first reflector layer 12 but containing the opposite type of impurity to that of the first reflect layer 12. That is, the second reflector layer 16 is formed by alternately depositing p-type $Al_xGa_{1-x}As$ and p-type AlAs on the active layer 14. The second reflector layer 16 has a reflectivity of approximately 99.6%, to emit the light lased in the active layer 14. Further, the first and second reflector layers 12 and 16 move electrons and holes toward the active layer 14 by applying voltage to the substrate 10 and the electrode layer 20, each being connected to an external power source. The active layer 14 generates light by an energy transition resulting from the reunion of electrons and holes. The active layer 14 may have a single quantum-well structure, a multi-quantum-well structure or a superlattice structure, and can be formed of a single semiconductor material or a non-conductive material.

The electrode layer 20 is formed with a cavity 22 for emitting light transmitted through the second reflector layer 16. The electrode layer 20 is formed of a metal having a high electrical conductivity for an electrical connection with the external power source. With power supplied to the electrode layer 20 and substrate 10, respectively, current flows in the VCSEL.

A high-resistance portion 18 is formed in second reflector layer 16, spaced from the lower surface of the cavity 22, by implanting ions or protons into the second reflector layer 16. The high-resistance portion 18 restricts the current flow within the VCSEL to increase the output of light lased in the active layer 14 and emitted via the cavity 22.

However, part of the light passing through an area other than high resistant portion 18 moves toward a protruding portion 21 of the electrode layer 20, extended inside the cavity 22. Here, since the electrode layer 20 is formed of a metal having a high electrical conductivity such as gold or copper, most of light incident to this metal layer is reflected therefrom and travels toward the second reflector layer 16. The light travelling toward the second reflector layer 16 influences the light emitted from the cavity 22. Thus, the single mode and the intensity of lased light are influenced.

SUMMARY OF THE INVENTION

To overcome the above problem, the object of the present invention is to provide a VCSEL in which the structure of an electrode layer is improved to obtain a uniform intensity of emitted light.

To achieve the above object, there is provided a VCSEL comprising a substrate, a first reflector layer formed of a semiconductor material containing impurities, on the substrate, an active layer formed on the first reflector layer, for generating laser beams, a second reflector layer formed of a semiconductor material having the opposite type of impurities to those of the semiconductor material used for the first reflector layer, on the active layer, and an electrode layer formed on the second reflector layer and having a cavity for emitting light from the second reflector layer. The electrode layer has a metal layer having a high electrical conductivity and connected to an external power source, and a conductive auxiliary reflector layer formed under the metal layer, and having a reflectivity which is lower than those of the first and second reflector layers.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
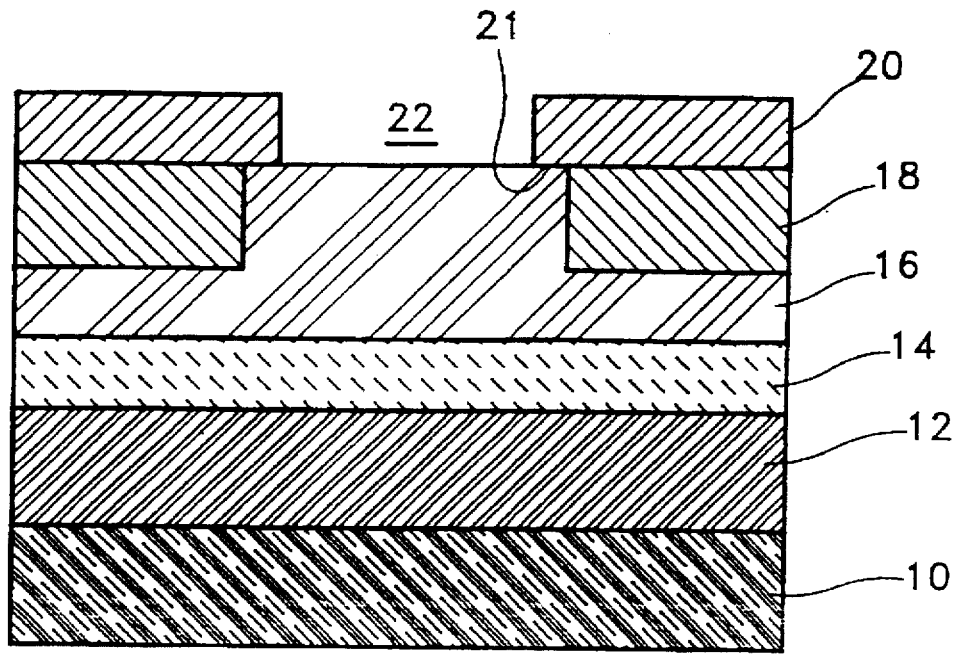
FIG. 1 is a schematic sectional view of a conventional VCSEL.
Figure 2:
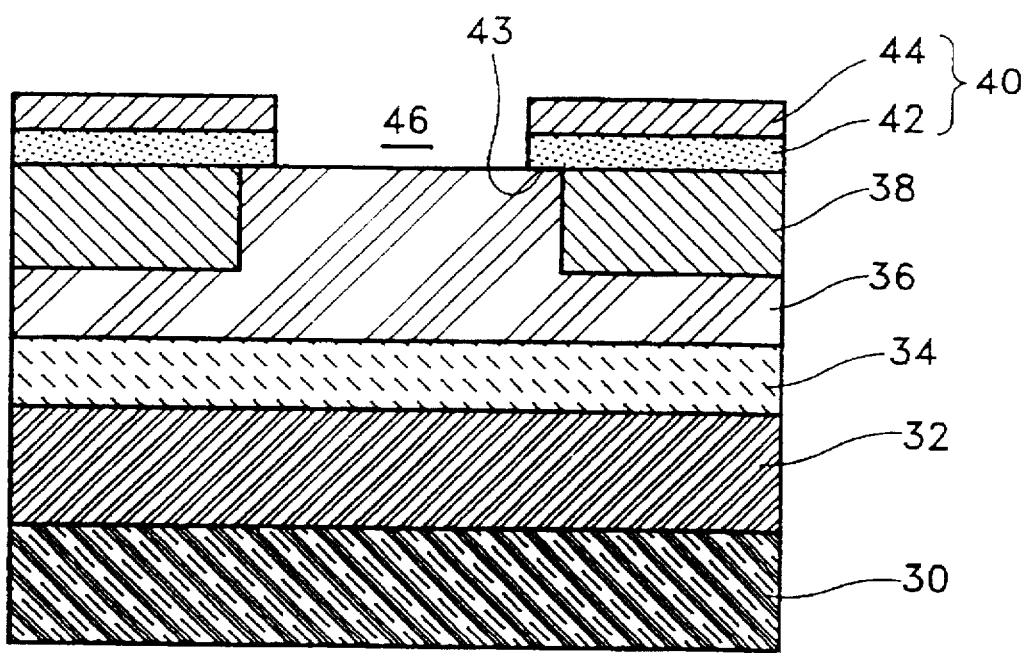
FIG. 2 is a schematic sectional view of a VCSEL according to the present invention.

As shown in FIG. 2, a VCSEL of the present invention is comprised of a substrate 30, and a first reflector layer 32, an active layer 34, a second reflector layer 36, and an electrode layer 40 which are all sequentially formed on the substrate 30.

The substrate 30 is doped with a semiconductor material containing an n-type impurity, for example, n-type GaAs, and is connected to an external power source. The first reflector layer 32 is formed by alternately depositing on substrate 30 semiconductor materials containing impurities of the same type as that of the substrate 30, for example, n-type $Al_xGa_{1-x}As$ and n-type AlAs. The first reflector layer 32 has a high reflectivity of about 99.9% and transmits light in a particular wavelength range, which is lased in the active layer 32. The second reflector layer 36 is formed of the semiconductor materials used for the first reflector layer 32 but containing the opposite type of impurities to those of the first reflector layer 32. That is, the second reflector layer 36 is formed by alternately depositing p-type $Al_xGa_{1-x}As$ and p-type AlAs on the active layer 34. The second reflector layer 36 has a reflectivity of approximately 99.6% to emit light lased in the active layer 34. Further, the first and second reflector layers 32 and 36 guide electrons and holes toward the active layer 34 by applying voltage to the substrate 30 and electrode layer 40, each being connected to the external power source. The active layer 34 generates light by an energy transition resulting from reunion of electrons and holes. The active layer 34 may have a single quantum-well structure, a multi-quantum-well structure, or a super-lattice structure.

The electrode layer 40 is formed with a cavity 46 for emitting light transmitted from the second reflector layer 36.

The electrode layer 40 is a double layer of a metal layer 44 and a conductive auxiliary reflector layer 42. The metal layer 44 is connected to the external power source and preferably formed of metal having a high electrical conductivity such as gold or silver.

Between the metal layer 44 and second reflector layer 36, the auxiliary reflector layer 42 is formed of nickel, molybdenum, platinum or chromium. The reflectivity of the auxiliary reflector layer 42 is approximately 98–99%, which is lower than those of the first and second reflector layers 32 and 36. Therefore, the intensity of the light reflected from the lower surface of a protruding portion 43 of the auxiliary reflector layer 42 is smaller than that of the light reflected from the cavity 46. Thus, the auxiliary reflector layer 42 suppresses the emission of light of high-degree modes and thus serves to emit low-noise light of a single mode via the cavity 46.

Further, a high-resistance portion 38 may be further provided in the second reflector layer 36, spaced from the lower surface of the cavity 46, by implanting ions or protons into the second reflector layer 36. The high-resistance portion 38 restricts current flow, thereby increasing the intensity of light lased in the active layer 34 and emitted from the cavity 46.

Therefore, since the VCSEL of the present invention suppresses the emission of light of high-degree modes, the optical properties of light emitted from the cavity are improved so that the light maintains a basic single mode.

Although a preferred embodiment has been described, it will be appreciated that modifications and substitutions can be made without departing from the spirit and scope of the invention.

What is claimed is:

1. A vertical cavity surface emitting laser comprising:

a substrate;

a first reflector layer formed of a semiconductor material containing impurities of a first type, on said substrate;

an active layer formed on said first reflector layer;

a second reflector layer formed of a semiconductor material containing impurities of a second type opposite of said first type, on said active layer, laser beams being generated in said active layer between said first and second reflectors; and an electrode layer formed on said second reflector layer and having a cavity for emitting light from said second reflector layer, wherein said electrode layer comprises a metal layer having a high electrical conductivity and connected to an external power source, and a conductive auxiliary reflector layer formed under said metal layer, and having a reflectivity which is lower than those of said first and second reflector layers.

2. The vertical cavity surface emitting laser as claimed in claim 1, wherein the reflectivity of said auxiliary reflector layer is approximately 98 to 99 percent.

3. The vertical cavity surface emitting laser as claimed in claim 1, wherein a high-resistance portion is formed in said second reflector layer, spaced from said cavity, so as to increase the intensity of the light emitted via said cavity.

4. The vertical cavity surface emitting laser as claimed in claim 3, wherein said high-resistance portion is formed by implanting ions or protons into said second reflector layer.

5. The vertical cavity surface emitting laser as claimed in claim 1, wherein the reflectivity of said auxiliary reflector layer is less than 99.6 percent.

6. The vertical cavity surface emitting laser as claimed in claim 1, wherein said metal layer is formed of gold or silver.

7. The vertical cavity surface emitting laser as claimed in claim 1, wherein said auxiliary reflector layer is formed from a material chosen from the group consisting of: nickel, platinum, molybdenum and chromium.

8. The vertical cavity surface emitting laser as claimed in claim 6, wherein said auxiliary reflector layer is formed from a material chosen from the group consisting of: nickel, platinum, molybdenum and chromium.

* * * * *